(12) United States Patent
Har et al.

(10) Patent No.: US 7,816,956 B2
(45) Date of Patent: Oct. 19, 2010

(54) POWER-ON RESET CIRCUIT

(75) Inventors: Dong-Soo Har, Gwangju (KR); Yousaf Zafar, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 12/182,439

(22) Filed: Jul. 30, 2008

(65) Prior Publication Data

US 2009/0256597 A1    Oct. 15, 2009

(30) Foreign Application Priority Data

Apr. 10, 2008    (KR) .................... 10-2008-0033041

(51) Int. Cl.
*H03L 7/00*    (2006.01)
(52) U.S. Cl. .................. 327/143; 327/142; 327/198

(58) Field of Classification Search .............. 327/142, 327/143, 198
See application file for complete search history.

(56) References Cited

U.S. PATENT DOCUMENTS 7,518,419 B1 *   4/2009   Pasqualini ................. 327/143
2007/0216380 A1 *   9/2007   Hack et al. ................. 323/269

* cited by examiner

*Primary Examiner*—Lincoln Donovan
*Assistant Examiner*—Daniel Rojas

(57) ABSTRACT

A power-on reset circuit according to an embodiment of the present invention includes an input control unit configured to generate a default input signal in response to a power-on reset signal and a clock, a counting unit configured to perform a counting operation in response to the default input signal to generate a count offset signal, and a power-on reset unit configured to perform a counting operation in response to the count offset signal to generate the power-on reset signal.

19 Claims, 4 Drawing Sheets

POWER-ON RESET CIRCUIT

CROSS-REFERENCE TO RELATED PATENT APPLICATION

The present application claims the benefit under 35 U.S.C 119(a) to Korean Application No. 10-2008-0033041, filed on Apr. 10, 2008, in the Korean Intellectual Property Office, the disclosure of which is incorporated herein by reference in its entirety as if set forth in full.

BACKGROUND

1. Technical Field

The present invention relates to a semiconductor integrated circuit, and in particular, to a power-on reset circuit to be used in a semiconductor integrated circuit.

2. Related Art

In general, semiconductor integrated circuits generate power-on reset signals upon initial operation to initialize the operation of each of the internal circuits formed therein. In order to generate such power-on reset signals, the semiconductor integrated circuits have power-on reset circuits. General power-on reset circuits are configured as analog circuits so that, if a level of an external power supply voltage reaches a preset level upon the initial operation of semiconductor integrated circuits, power-on reset signals are enabled.

This analog-type power-on reset circuit includes a voltage detector configured to detect the level of the external power supply voltage, and a signal generator configured to generate a power-on reset signal on the basis of the level detection results by the voltage detector. The power-on reset circuit has a plurality of switching elements formed therein and each of the switching elements operates in response to continuous changes of a voltage level. The switching elements of the semiconductor integrated circuit may vary in their operation property according to a variation in PVT (process, voltage, and temperature). However, power-on reset circuits implemented as analog circuits are configured to have switching elements that are sensitive to variations in PVT. For this reason, stability in the operation is not ensured.

For example, if a variation in the property of the internal switching elements causes a phenomena such as glitches and the power-on reset signal is disabled in error at the time it should be enabled, each of the internal circuits of the semiconductor integrated circuit does not initialize, in which a normal operation of the semiconductor integrated circuit is not performed. As described above, since general power-on reset circuits are implemented as analog circuits, there are technical restrictions in the stability of the operation and the reliability of the general operation of the semiconductor integrated circuit is low.

SUMMARY

Embodiments of the present invention provide a digital power-on reset circuit which improves the stability of a power-on reset signal, thereby enhancing the reliability of a semiconductor integrated circuit.

According to an embodiment of the invention, a power-on reset circuit includes: an input control unit configured to generate a default input signal in response to a power-on reset signal and a clock; a counting unit configured to perform a counting operation in response to the default input signal to generate a count offset signal; and a power-on reset unit configured to perform a counting operation in response to the count offset signal to generate the power-on reset signal.

According to another embodiment of the invention, a power-on reset circuit includes: a first counting unit configured to perform a counting operation up to a predetermined offset value in response to a first default input signal to generate a first count offset signal; a second counting unit configured to perform a counting operation up to a predetermined offset value in response to a second default input signal to generate a second count offset signal; a power-on reset unit configured, when both of the first count offset signal and the second count offset signal are enabled, to perform a counting operation up to a predetermined offset value to generate a power-on reset signal; and an input control unit configured to alternately enable the first default input signal and the second default input signal in response to the power-on reset signal.

According to the embodiments of the invention, a power-on reset circuit is implemented in a digital type in which counting up to a predetermined offset value is performed when power and clock are stabilized. Therefore, it is possible to reduce errors due to variations in PVT and so on, thereby improving the stability of a power-on reset signal.

DETAILED DESCRIPTION

Hereinafter, exemplary embodiments of the invention will be described in detail with reference to the accompanying drawings.

Figure 1:
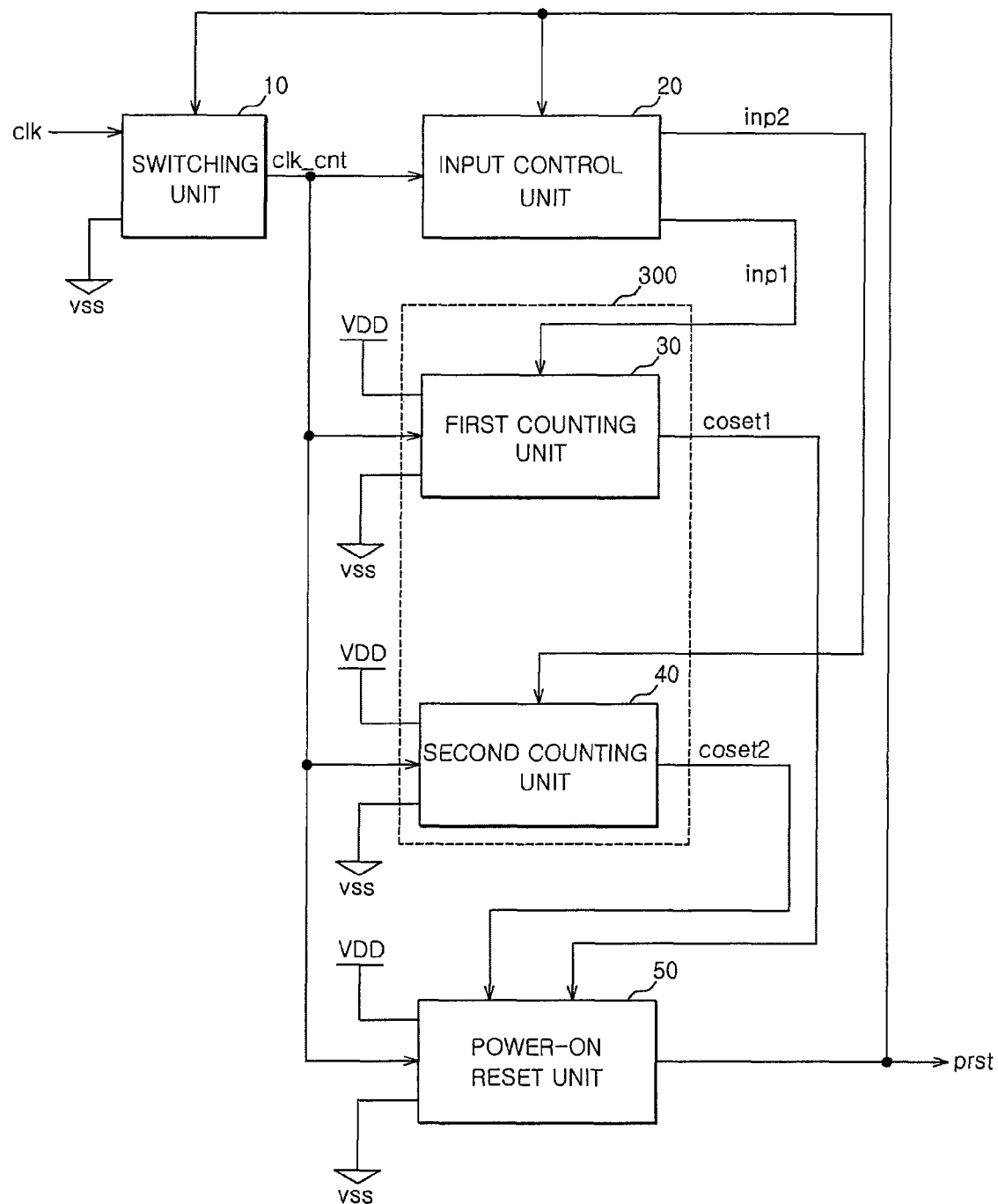
FIG. 1 is a block diagram illustrating a configuration of a power-on reset circuit according to an embodiment of the present invention.

Referring to FIG. 1, a power-on reset circuit includes: a switching unit 10, an input control unit 20, a first counting unit 30, a second counting unit 40, and a power-on reset unit 50.

The switching unit 10 selectively outputs either a clock clk or a ground voltage VSS as a count control clock clk_cnt in response to a power-on reset signal prst. An input control unit 20 generates a first default input signal inp1 and a second default input signal inp2 in response to the power-on reset signal prst and the count control clock clk_cnt. A first counting unit 30 performs a counting operation in response to the first default input signal inp1 and the count control clock clk_cnt to generate a first count offset signal coset1. A second counting unit 40 performs a counting operation in response to the second default input signal inp2 and the count control clock clk_cnt to generate a second count offset signal coset2. A power-on reset unit performs a counting operation in response to the first count offset signal coset1, the second count offset signal coset2, and the count control clock clk_cnt to generate the power-on reset signal.

Since the first counting unit 30 and the second counting unit 40 are similar in the configuration and operation, they can be called a counting unit 300. That is, the counting unit 300 performs a counting operation in response to the first default input signal inp1 and the second default input signal inp2 to generate the first count offset signal coset1 and the second count offset signal coset2.

The first counting unit 30, the second counting unit 40, and the power-on reset unit 50 each are supplied with an external power supply voltage VDD and a ground voltage VSS. As described above, the first counting unit 30, the second counting unit 40, and the power-on reset unit 50 each perform a counting operation. During the counting operation, counters provided inside those units use various combinations of the external power supply voltage VDD and the ground voltage VSS as defaults. The counters provided in the first counting unit 30, the second counting unit 40, and the power-on reset unit 50 each perform a counting operation until an output value thereof reaches a predetermined offset value. The offset values set for the first counting unit 30, the second counting unit 40, and the power-on reset unit 50 may differ from one other. Timings when each of the first count offset signal coset1, the second count offset signal coset2, and the power-on reset signal prst are enabled can be determined according to the timings for each of the output values of the counters to reach a corresponding offset value.

The clock clk can be generally a clock generated in a semiconductor integrated circuit. The clock can stably toggle if a predetermined amount of time passes since the operation of a semiconductor integrated circuit starts. The switching unit 10 may be implemented by using a general multiplexing circuit. The switching unit 10 outputs the clock clk as the count control clock clk_cnt until the power-on reset signal prst is enabled and outputs the ground voltage VSS as the count control clock clk_cnt if the power-on reset signal prst is enabled. Thus, after the power-on reset signal prst is enabled, the operation of each of the counters receiving the count control clock clk_cnt stops.

The input control unit 20 generates the first default input signal inp1 and the second default input signal inp2 in response to the count control clock clk_cnt when the power-on reset signal prst is enabled. The first default input signal inp1 and the second default input signal inp2 are generated to have opposite logic levels and each have a clock form toggling every period which is four times the period of the count control clock clk_cnt.

The first default input signal inp1 and the second default input signal inp2 are implemented as low enable signals. Therefore, the first counting unit 30 receives a default when the first default input signal inp1, and performs a counting operation when the first default input signal inp1 is disabled. Further, the second counting unit 40 receives a default when the second default input signal inp2 is enabled, and performs a counting operation when the second default input signal inp2 is disabled. Since the first default input signal inp1 and the second default input signal inp2 have opposite logic levels, the first counting unit 30 and the second counting unit 40 alternately perform counting operations during a time period corresponding two period of the count control clock clk_cnt.

The counter of the first counting unit 30 may receive the default from the external power supply voltage VDD and the ground voltage VSS during an enable section of the first default input signal inp1, and output the predetermined offset value within the sequential first disable section. If the output signal of the counter reaches the predetermined offset value, the final output signal of the first counting unit 30, that is, the first count offset signal coset1 is enabled, and accordingly the operation of the counter stops.

Also, the counter of the second counting unit 40 may receive a default during an enable section of the second default input signal inp2, and output the predetermined offset value within the sequential first disable section. If the output signal of the counter reaches the predetermined offset value, the final output signal of the second counting unit 40, that is, the second count offset signal coset2 is enabled and accordingly the operation of the counter stops.

The counter of the power-on reset unit 50 receives a default from the external power supply voltage VDD and the ground voltage VSS before the first count offset signal coset1 and the second count offset signal coset2 are both enabled. If both the first count offset signal coset1 and the second count offset signal coset2 are enabled, the power-on reset unit 50 performs a counting operation from the received default up to the predetermined offset value. Then, if the output signal of the counter of the power-on reset unit 50 reaches the predetermined offset value, the power-on reset unit enables the power-on reset signal prst. If the power-on reset signal prst is enabled, the toggling of the count control clock clk_cnt, the operation of the input control unit 20, and the counting operation of the power-on reset unit 50 stop.

As described above, unlike the analog type according to the related art in which the power-on reset signal prst is enabled according to the level of the external power supply voltage VDD, the power-on reset circuit according the embodiment of the present invention is implemented as a digital circuit, in which after the external power supply voltage VDD and the clock clk are stabilized, a counting operation is performed, and if the signal generated by the counting operation reaches the predetermined offset value, the power-on reset signal prst is enabled. Therefore, it is possible to prevent the power-on reset signal prst from being abnormally disabled due to a glitch caused when each element is erroneously operated due to variations in PVT. Further, since the power-on reset signal prst is stably generated, the reliability of the semiconductor integrated circuit can be enhanced.

Figure 2:
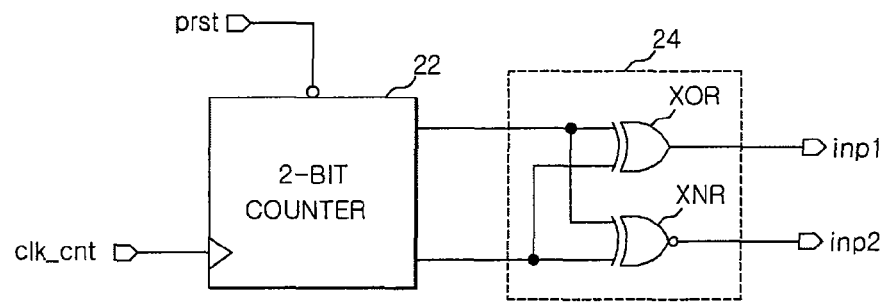
FIG. 2 is a diagram illustrating a detailed configuration of an input control unit shown in FIG. 1.

Referring to FIG. 2, the input control unit 20 includes a 2-bit counter 22 configured to generate a 2-bit signal in response to the power-on reset signal prst and the count control clock clk_cnt, and a signal generator 24 configured to generate the first default input signal inp1 and the second default input signal inp2 in response to the output signal of the 2-bit counter 22.

The 2-bit counter 22 operates when the power-on reset signal prst is disabled and performs a counting operation in synchronization with the toggling timings of the count control clock clk_cnt. The 2-bit signal output from the 2-bit counter 22 can have any default and the 2-bit counter 22 performs a counting operation by increasing or decreasing the count value by a logic value '1' in synchronization with the count control clock clk_cnt.

The signal generator 24 includes an exclusive OR gate XOR configured to output the first default input signal inp1 in response to the 2-bit output signal of the 2-bit counter 22, and an exclusive NOR gate XNR configured to output the second default input signal inp2 in response to the 2-bit output signal of the 2-bit counter 22.

The logic value of the 2-bit output signal of the 2-bit counter 22 may be changed in the order of (0,0), (0,1), (1,0), and (1,1). The exclusive OR gate XOR and the exclusive NOR gate XNR determining whether the logic values of two signals are equal to or different from each other alternately enable the first default input signal inp1 and the second default input signal inp2 every time period corresponding to two times the period of the count control clock clk_cnt. Such an operation continues until the power-on reset signal prst is enabled.

Figure 3A:
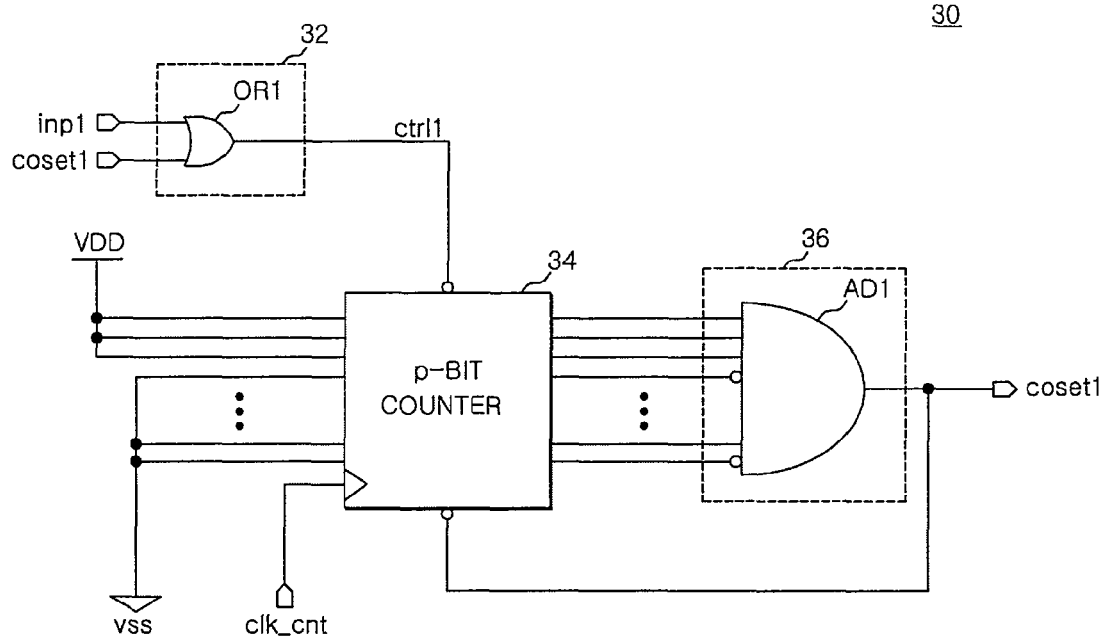
FIG. 3A is a diagram illustrating a configuration of a first counting unit shown in FIG. 1.

Referring to FIG. 3A, the first counting unit 30 includes a first controller 32, a p-bit counter 34, and a first offset determining section 36.

A first controller 32 generates a first control signal ctrl1 in response to the first default input signal inp1 and the first count offset signal coset1. A p-bit counter 34 performs a counting operation from a p-bit default supplied from the external power supply voltage VDD and the ground voltage VSS in response to the first control signal ctrl1 and the first count offset signal coset1. A first offset determining unit 36 determines whether the output signal of the p-bit counter 34 reaches a predetermined offset value to generate the first count offset signal coset1.

The first controller 32 may be formed of an OR gate OR1.

The p-bit counter 34 receives a default when the first control signal ctrl1 is at a low level, and performs a counting operation when the first control signal ctrl1 is changed to a high level. The default for the p-bit counter 34 is implemented by a combination of the external power supply voltage VDD and the ground voltage VSS. In order to perform this operation, the default of the p-bit counter 34 should be predetermined by a designer, similar to the offset value of the output signal. The p-bit counter 34 increases the count value by a logic value '1' in synchronization with the count control clock clk_cnt. Then, if the first count offset signal coset1 output from the first offset determining section 36 and fed back to the p-bit counter 34 is enabled as the high level, the operation of the p-bit counter 34 stops.

The first offset determining section 36 includes an AND gate AD1 receiving the p-bit signal output from the p-bit counter 34. The AND gate AD1 should have p-number of signal input terminals and the p-number of input terminals may include at least one inversion terminal. At least one inversion terminal of the p-number of input terminals is disposed according to the offset value set by the designer.

As described above, the first default input signal inp1 has an enable section corresponding to two times the period of the count control clock clk_cnt and the enable section is repeated. The first count offset signal coset1 should be enabled within the first disable section of the first default input signal inp1. Accordingly, the offset value of the output signal of the p-bit counter 34 has a value larger than the logic value of the default for the p-bit counter 34 by '2'. In other words, during an enable section of the first default input signal inp1, the p-bit counter 34 performs an up-count operation on the default twice and outputs the offset value. Then, if the output signal of the p-bit counter 34 reaches the offset value, the first offset determining section 36 enables the first count offset signal coset1. In response to the enabled first count offset signal coset1, the operation of the p-bit counter 34 stops.

Figure 3B:
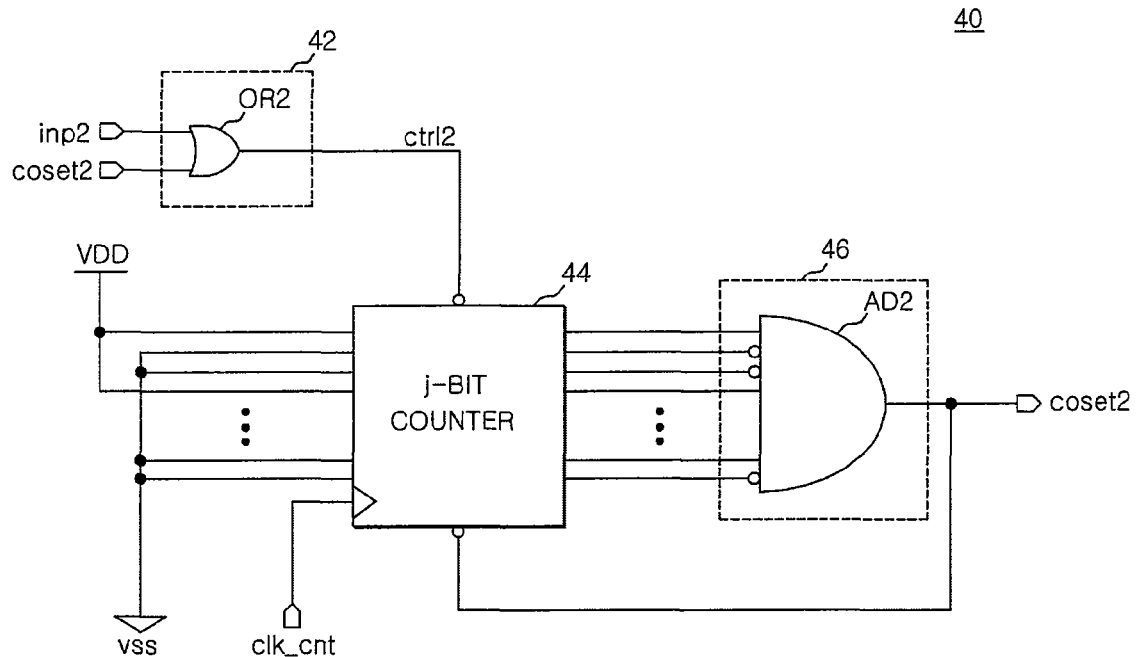
FIG. 3B is a diagram illustrating a configuration of a second counting unit shown in FIG. 1.

As shown in FIG. 3B, the second counting unit 40 has a configuration similar to the first counting unit 30. In other words, the second counting unit 40 includes a second controller 42, a j-bit counter 44, and a second offset determining section 46. The second controller 42 generates a second control signal ctrl2. The second controller 42 includes an OR gate OR2 and the second offset determining section 46 includes an AND gate AD2.

The operation of the second counting unit 40 can be understood through the operation of the first counting unit 30. However, a default for the j-bit counter 44 may be implemented in a combination different from the default for the p-bit counter 34 and the offset value determined by the second offset determining section 46 may be implemented in a form different from the offset value of the first offset determining section 36. In this configuration, the j-bit counter 44 of the second counting unit 40 performs a counting operation during the first disable section of the second default input signal inp2. Then, if the output signal of the j-bit counter 44 reaches the predetermined offset value, the second counting unit 40 enables the second count offset signal coset2. In response to the enabled second count offset signal coset2, the operation of the j-bit counter 44 stops.

Figure 4:
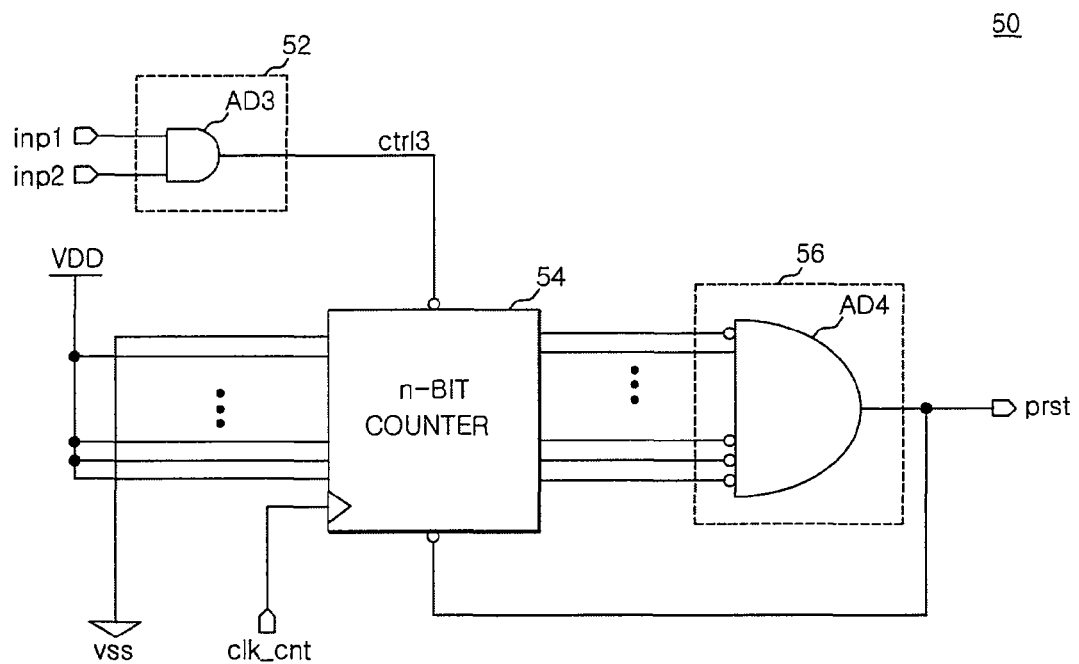
FIG. 4 is a diagram illustrating a detailed configuration of a power-on reset unit shown in FIG. 1.

Referring to FIG. 4, the power-on reset unit 50 includes a third controller 52, an n-bit counter 54, and a third offset determining section 56.

A third controller 52 generates a third control signal ctrl3 in response to the first count offset signal coset1 and the second count offset signal coset2. An n-bit counter 54 performs a counting operation from an n-bit default provided from the external power supply voltage VDD and the ground voltage VSS to output an n-bit signal. A third offset determining section 56 determines whether the output signal of the n-bit counter 54 reaches a predetermined offset value and to generate the power-on reset signal prst.

Here, the third control signal ctrl3 is a low enable signal, and the third controller 52 include an AND gate AD3. Therefore, the third control signal ctrl3 can maintain an enable section until both of the first count offset signal coset1 and the second count offset signal coset2 are enabled.

The n-bit counter 54 may receive a default implemented by a combination of the external power supply voltage VDD and the ground voltage VSS when the third control signal ctrl3 is enabled. Then, if the first count offset signal coset1 and the second count offset signal coset2 are sequentially enabled as a high level, the third control signal ctrl3 is changed to a high level. Therefore, the n-bit counter 54 starts a counting operation. The default of the n-bit counter 54 should be predetermined by the designer, similar to the offset value of the output signal. The n-bit counter 54 increases the count value by a logic value '1' in synchronization with the count control clock clk_cnt.

The third offset determining section 56 includes an AND gate AD4 receiving the n-bit signal output from the n-bit counter 54. The AND gate AD4 should have n-number of signal input terminals and the n-number of input terminals may include at least one inversion terminal. At least one inversion terminal is disposed according to the offset value set by the designer. In other words, if the output signal of the n-bit counter 54 reaches the predetermined offset value, the third offset determining section 56 enables the power-on reset signal prst as a high level. In response to the enabled power-on reset signal prst, the n-bit counter 54 stops the counting operation.

As described above, the power-on reset signal prst is enabled after the n-bit counter 54 of the power-on reset unit 50 performs a counting operation for a predetermined amount of time. If the power-on reset signal prst is enabled, the count control clock clk_cnt output from the switching unit 10 exhibits the same form as the ground power VSS, and the operation of the input control unit 20 stops. In other words, the operation of the whole power-on reset circuit is completed.

Figure 5:
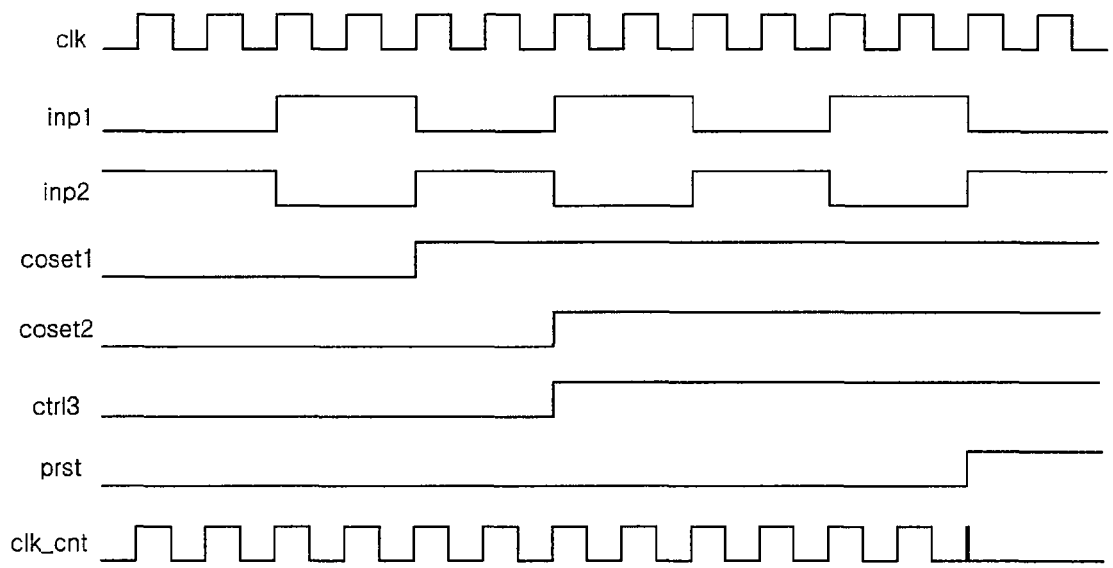
FIG. 5 is a timing chart illustrating an operation of the power-on reset circuit according to the embodiment of the present invention.

In FIG. 5, the clock clk, the first default input signal inp1, and the second default input signal inp2 are shown. As shown in FIG. 5, the first default input signal inp1 and the second default input signal inp2 have opposite phases.

As described above, the first counting unit 30 enables the first count offset signal coset1 during the first disable section of the first default input signal inp1. Accordingly, the first count offset signal coset1 exhibits a waveform in which it is enabled at a time point when the first disable section of the first default input signal inp1 finishes. The second counting unit 40 enables the second count offset signal coset2 during the first disable section of the second default input signal inp2. Accordingly, the second count offset signal coset2 exhibits a waveform in which it is enabled at a time point when the first disable section of the second default input signal inp2 finishes.

Since the third control signal ctrl3 is generated by performing an AND operation on the first count offset signal coset1 and the second count offset signal coset2, it is enabled in synchronization with the timing when the second count offset signal coset2 is enabled. If the third control signal ctrl3 is enabled, the n-bit counter 54 of the power-on reset unit 50 starts a counting operation, and if the output signal of the n-bit counter 54 reaches the predetermined offset value, the power-on reset signal prst is enabled. If the power-on reset signal prst is enabled, the first default input signal inp1 and the second default input signal inp2 do not toggle any more, and the voltage level of the count control clock clk_cnt is transferred to the level of the ground voltage VSS.

As described above, a power-on reset circuit according to an embodiment of the present invention stably supports the initial operation of a semiconductor integrated circuit, thereby improving the reliability of the semiconductor integrated circuit. In other words, a power-on reset circuit is implemented as a digital circuit in which counting up to a predetermined offset value is performed when power and clock are stabled during an initial operation, thereby enabling the power-on reset signal. Therefore, it is possible to reduce errors due to variations in PVT and so on, thereby improving the stability of a power-on reset signal, as compared to an analog-type power-on reset circuit. Therefore, a power-on reset signal can be generated more stably and errors in the initial operation are reduced.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, such changes and modifications are seen to be within the true spirit and scope of the invention as defined by the appended claims. It will also be appreciated that the drawings and specification merely disclose typical embodiments of the invention and, although specific terms are employed, they are used in a generic and descriptive sense only and not for purposes of limitation.

What is claimed is:

1. A power-on reset circuit, comprising:
   an input control unit configured to generate a default input signal in response to a power-on reset signal and a clock;
   a counting unit configured to perform a counting operation in response to the default input signal to generate a count offset signal;
   a power-on reset unit configured to perform a counting operation in response to the count offset signal to generate the power-on reset signal, and
   a switching, unit configured to receive a clock and a ground voltage, to output the clock as a count control clock before the power-on reset signal is enabled, and to output the ground voltage as the count control clock when the power-on reset signal is enabled,
   wherein the default input signal includes a first default input signal and a second default input signal, and when the power-on reset signal is disabled, the input control unit is configured to generate the first default input signal and the second default input signal toggling between opposite logic levels in response to the count control clock, and wherein the input control unit includes:
   a 2-bit counter configured to generate a 2-bit signal in response to the power-on reset signal and the count control clock, and
   a signal generator configured to receive the output signal of the 2-bit counter and to generate the first default input signal and the second default input signal.

2. The power-on reset circuit of claim 1, wherein the power-on reset signal initializes the operation of each internal circuit of a semiconductor integrated circuit.

3. The power-on reset circuit of claim 1, wherein the count offset signal includes a first count offset signal and a second count offset signal, and the counting unit includes:
   a first counting unit configured to perform a counting operation in response to the first default input signal and the count control clock and to generate the first count offset signal; and
   a second counting unit configured to perform a counting operation in response to the second default input signal and the count control clock and to generate the second count offset signal.

4. The power-on reset circuit of claim 3, wherein the first counting unit is configured to receive a default provided by a combination of an external power supply voltage and a ground voltage when the first default input signal is enabled, and to perform a counting operation up to a predetermined offset value to generate the first count offset signal when the first default input signal is disabled.

5. The power-on reset circuit of claim 4, wherein the first counting unit includes:
   a controller configured to receive the first default input signal and the first count offset signal and to generate a control signal;
   a counter configured to perform a counting operation from the default in response to the control signal and the first count offset signal and to generate a plural-bit signal; and
   an offset determining section configured to determine whether the output signal of the counter reaches a predetermined offset value and to generate the first count offset signal.

6. The power-on reset circuit of claim 3, wherein the second counting unit is configured to receive a default provided by a combination of an external power supply voltage and a ground voltage when the second default input signal is enabled, and to perform a counting operation up to a predetermined offset value to generate the second count offset signal when the second default input signal is disabled.

7. The power-on reset circuit of claim 6, wherein the second counting unit includes:
   a controller configured to receive the second default input signal and the second count offset signal and to generate a control signal;
   a counter configured to perform a counting operation from the default in response to the control signal and the second count offset signal and to generate a plural-bit signal; and
   an offset determining section configured to determine whether the output signal of the counter reaches a predetermined offset value and to generate the second count offset signal.

8. The power-on reset circuit of claim 3, wherein the power-on reset unit is configured to receive a default provided by a combination of an external supply power voltage and a ground voltage when at least one of the first count offset signal and the second count offset signal is disabled, and to perform a counting operation to generate the power-on reset signal when both of the first count offset signal and the second count offset signal are enabled.

9. The power-on reset circuit of claim 8, wherein the power-on reset unit includes:
   a controller configured to receive the first count offset signal and the second count offset signal and to generate a control signal;
   a counter configured to perform a counting operation from the default in response to the control signal and the power-on reset signal and to generate a plural-bit signal; and
   an offset determining section configured to determine whether the output signal of the counter reaches a predetermined offset value and to generate the power-on reset signal.

10. A power-on reset circuit, comprising:
    a first counting unit configured to perform a counting operation up to a predetermined offset value in response to a first default input signal to generate a first count offset signal;
    a second counting unit configured to perform a counting operation up to a predetermined offset value in response to a second default input signal to generate a second count offset signal;
    a power-on reset unit configured to, when both of the first count
    offset signal and the second count offset signal are enabled to perform a counting operation up to a predetermined offset value to generate a power-on reset signal;
    an input control unit configured to alternately enable the first default input signal and the second default input signal in response to the power-on reset signal; and
    a switching unit configured to receive a clock and a ground voltage, to generate the clock as a count control clock before the power-on reset signal is enabled, to generate the ground voltage as the count control clock when the power-on reset signal is enabled, and to output the count control clock to the first counting unit, the second counting unit, the power-on reset unit, and the input control unit.

11. The power-on reset circuit of claim 10, wherein the power-on reset signal initializes the operation of each internal circuit of a semiconductor integrated circuit.

12. The power-on reset circuit of claim 10, wherein the first counting unit is configured to receive a default supplied by a combination of an external power supply voltage and the ground voltage when the first default input signal is enabled, and to perform a counting operation up to a predetermined offset value to generate the first count offset signal when the first default input signal is disabled.

13. The power-on reset circuit of claim 12, wherein the first counting unit includes:
    a controller configured to receive the first default input signal and the first count offset signal and to generate a control signal;
    a counter configured to perform a counting operation from the default in response to the control signal and the first count offset signal and to generate a plural-bit signal; and
    an offset determining section configured to determine whether the output signal of the counter reaches a predetermined offset value and to generate the first count offset signal.

14. The power-on reset circuit of claim 10, wherein the second counting unit is configured to receive a default supplied by a combination of an external power supply voltage and the ground voltage when the second default input signal is enabled, and to perform a counting operation up to a predetermined offset value to generate the second count offset signal when the second default input signal is disabled.

15. The power-on reset circuit of claim 14, wherein the second counting unit includes:
    a controller configured to receive the second default input signal and the second count offset signal and to generate a control signal;
    a counter configured to perform a counting operation from the default in response to the control signal and the second count offset signal and to generate a plural-bit signal; and
    an offset determining section configured to determine whether the output signal of the counter reaches a predetermined offset value and to generate the second count offset signal.

16. The power-on reset circuit of claim 10, wherein the power-on reset unit is configured to receive a default provided by a combination of an external supply power voltage and the ground voltage when at least one of the first count offset signal and the second count offset signal is disabled, and to perform a counting operation from the default to a predetermined offset value to generate the power-on reset signal when both of the first count offset signal and the second count offset signal are enabled.

17. The power-on reset circuit of claim 16, wherein the power-on reset unit includes:
    a controller configured to receive the first count offset signal and the second count offset signal and to generate a control signal;
    a counter configured to perform a counting operation from the default in response to the control signal and the power-on reset signal and to generate a plural-bit signal; and
    an offset determining section configured to determine whether the output signal of the counter reaches a predetermined offset value and to generate the power-on reset signal.

18. The power-on reset circuit of claim 10, wherein, when the power-on reset signal is disabled, the input control unit is configured to generate the first default input signal and the second default input signal in response to the count control clock.

19. The power-on reset circuit of claim 18, wherein the input control unit includes:
    a 2-bit counter configured to generate a 2-bit signal in response to the power-on reset signal and the count control clock; and
    a signal generator configured to receive the output signal of the 2-bit counter and to generate the first default input signal and the second default input signal.

* * * * *